(12) United States Patent
Camacho et al.

(10) Patent No.: US 8,120,156 B2
(45) Date of Patent: Feb. 21, 2012

(54) INTEGRATED CIRCUIT PACKAGE SYSTEM WITH DIE ON BASE PACKAGE

(75) Inventors: Zigmund Ramirez Camacho, Singapore (SG); Henry D. Bathan, Singapore (SG); Arnel Trasporto, Singapore (SG); Jeffrey D. Punzalan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 339 days.

(21) Appl. No.: 11/307,723

(22) Filed: Feb. 17, 2006

(65) Prior Publication Data

US 2007/0194424 A1    Aug. 23, 2007

(51) Int. Cl.
    *H01L 23/02*    (2006.01)
(52) U.S. Cl. ............... 257/686; 257/E23.085; 438/109
(58) Field of Classification Search .............. 257/686, 257/E23.085; 438/109
    See application file for complete search history.

(56) References Cited

U.S. PATENT DOCUMENTS

| | | | |
|---|---|---|---|
| 6,353,263 B1 * | 3/2002 | Dotta et al. .................. 257/777 |
| 6,521,881 B2 * | 2/2003 | Tu et al. ..................... 250/208.1 |
| 6,607,937 B1 * | 8/2003 | Corisis .......................... 438/108 |
| 6,853,064 B2 * | 2/2005 | Bolken et al. ................. 257/686 |
| 6,933,598 B2 | 8/2005 | Karnezos ..................... 257/686 |
| 6,946,323 B1 | 9/2005 | Heo .............................. 438/109 |
| 6,967,395 B1 | 11/2005 | Glenn et al. .................. 257/676 |
| 6,972,481 B2 | 12/2005 | Karnezos ..................... 257/686 |
| 7,091,060 B2 * | 8/2006 | Bolken et al. ................. 438/106 |
| 7,091,623 B2 * | 8/2006 | Tsai et al. ..................... 257/783 |
| 7,193,309 B2 * | 3/2007 | Huang et al. ................. 257/686 |
| 2006/0197207 A1 * | 9/2006 | Chow et al. .................. 257/686 |
| 2006/0220210 A1 * | 10/2006 | Karnezos et al. ............. 257/686 |
| 2006/0220256 A1 * | 10/2006 | Shim et al. ................... 257/777 |
| 2006/0249828 A1 * | 11/2006 | Hong ............................ 257/686 |
| 2007/0170570 A1 * | 7/2007 | Camacho et al. ............ 257/686 |

* cited by examiner

*Primary Examiner* — Benjamin Sandvik
*Assistant Examiner* — Krista Soderholm
(74) *Attorney, Agent, or Firm* — Mikio Ishimaru

(57) ABSTRACT

The present invention provides an integrated circuit package system with die on base package comprising forming a base package comprising, forming a substrate, mounting a first integrated circuit on the substrate, encapsulating the integrated circuit and the substrate with a molding compound, and testing the base package, attaching a bare die to the base package, connecting electrically the bare die to the substrate and encapsulating the bare die and the base package.

20 Claims, 6 Drawing Sheets

US 8,120,156 B2

INTEGRATED CIRCUIT PACKAGE SYSTEM WITH DIE ON BASE PACKAGE

TECHNICAL FIELD

The present invention relates generally to integrated circuit package systems, and more particularly to a system for package in package design and manufacture.

BACKGROUND ART

Semiconductors, or computer chips, have made their way into virtually every electrical product manufactured today. Chips are used not only in very sophisticated industrial and commercial electronic equipment, but also in many household and consumer items such as televisions, clothes washers and dryers, radios and telephones. As many of these types of products become smaller but more functional, there is a need to include more chips in these smaller products. The reduction in size of cellular telephones is one example of how more and more capabilities find their way into smaller and smaller electronic products.

The popularity of smaller and more complicated electronic products has placed increased demands on the packaging for chips used in such devices. These increased demands have led to new chip packaging concepts and approaches. Unpackaged chips are referred to as die or dies, and current packaging methods include placing more than one die in a single package. One such approach is to stack one die on top of another and then enclose the stack of dies in one package. The final package for the multiple-stacked semiconductor dies is much smaller than would result if the dies were each packaged separately. In addition to providing a smaller size, these packages offer a number of aspects that relate to the manufacturing of the package such as ease of handling and assembling.

An example of a die stacking technique incorporates a pair of stacked dies encapsulated in a molded plastic package that has connectors or leads extending out from the package which function as input/output terminals of the die inside the package. The package includes a substrate and a first die mounted on the top surface of the substrate. A second die is then stacked on top of the first die.

The substrate may be comprised of a flexible resin tape, a rigid fiber-glass/copper sheet laminate, a co-fired ceramic coupon, or a flexible metal lead frame, a ball grid array substrate or other well-known types of substrates in the semiconductor industry, depending on the particular type of semiconductor package being used.

The first die is conventionally mounted to the top surface of the substrate with, for example, a layer of an adhesive or an adhesive film, and then electrically connected to the substrate by a plurality of fine, conductive wires, typically gold (Au) or aluminum (Al), that electrically connects the die to the substrate. The wires are attached to the die at the bonding pads of the die which are located around the periphery of the die.

The second die is mounted on the top surface of the first die with an adhesive layer that is positioned within the central area of the top surface of the first die. The adhesive layer may contact or cover both the bonding pads of the first die and the conductive wires bonded to the first die. The adhesive layer positions the second die sufficiently far above the first die to prevent the dies from contacting each other or any wires connected to the dies. The second die is then wire bonded to the substrate in the same fashion as the first die. One or more additional dies can then be stacked on top of the second die using the same technique.

After the dies are wire bonded to the substrate, the dies, substrate, and conductive wires are covered with plastic, or other suitable material, which encapsulates the stacked dies and protects them from moisture and other environmental elements.

Despite efforts to overcome problems resulting in lower yields of semiconductor packages with stacked dies problems still exist. In particular, dies within the stack fail prematurely or are detected as being bad only after assembly.

Thus, a need still remains for a method of device stacking that allows improved yields and results in lower height packages. In view of the demand for increased volume and smaller packages, it is increasingly critical that answers be found to these problems. In view of the ever-increasing need to save costs and improve efficiencies, it is more and more critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system with die on base package including forming a base package comprising, forming a substrate, mounting a first integrated circuit on the substrate, encapsulating the integrated circuit and the substrate with a molding compound, and testing the base package, attaching a bare die to the base package, connecting electrically the bare die to the substrate and encapsulating the bare die and the base package.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
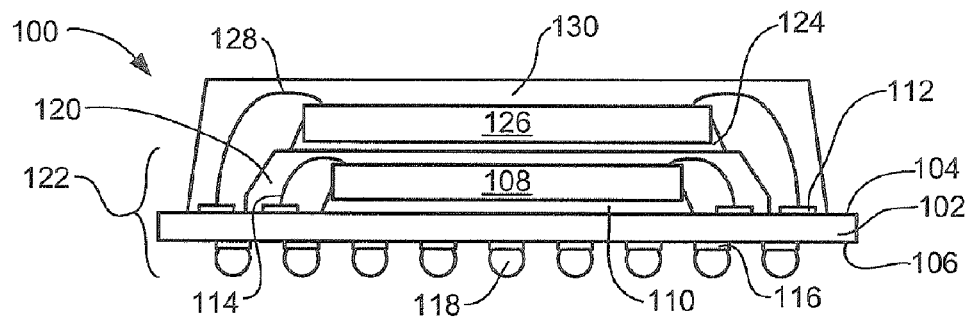
FIG. 1 is a cross-sectional view of an integrated circuit package system with die on base package, in an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact between the elements. The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system with die on base package 100, in an embodiment of the present invention. The cross-sectional view includes a substrate 102, such as a laminate substrate or ceramic substrate, having a top surface 104 and a bottom surface 106. An integrated circuit 108 is attached to the top surface 104 with an adhesive 110, such as a die attach material which may be of a conductive or a non-conductive type. Bond pads 112, configured in an inner row and an outer row, are on the top surface 104 proximate the integrated circuit 108 and are electrically connected by first bond wires 114. The inner row is closer to the integrated circuit 108 than the outer row. A substrate contact 116 is formed on the bottom surface 106 of the substrate 102. System interconnects 118, such as solder balls, solder columns or stud bumps, are attached to the substrate contact 116. A first molding compound 120 encapsulates the integrated circuit 108, the first bond wires 114, the inner row of the bond pads 112 and part of the top surface 104 of the substrate 102. The resulting structure is a base package 122, has a wide flange on the substrate 102 which supports the outer row of the bond pads 112. The base package 122 may be tested prior to further assembly. The testing of the base package 122 verifies the base package 122 to be known good.

With the base package 122 verified as known good, a layer of adhesive 124, such as the die attach material, is applied to the top of the base package 122 and a bare die 126, such as an unpackaged die, is attached thereon. Second bond wires 128 electrically connect the bare die 126 to the outer row of the bond pads 112. A second molding compound 130 is applied to encapsulate the bare die 126, the second bond wires 128 and the outer row of the bond pads 112. The finished package-in-package is then tested to verify that both integrated circuits are known good.

Figure 2:
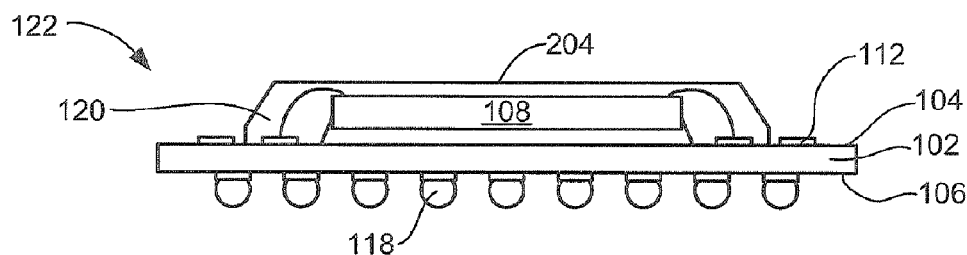
FIG. 2 is a more detailed cross-sectional view of the base package of the integrated circuit package system with die on base package, in an embodiment of the present invention.

Referring now to FIG. 2, therein is shown a more detailed cross-sectional view of the base package 122 of the integrated circuit package system with die on base package 100, in an embodiment of the present invention. The more detailed cross-sectional view depicts the base package 122 ready for the next level of assembly. The integrated circuit 108 may be an ultra thin die in order to facilitate a thin package structure. The substrate 102, having the top surface 104 and the bottom surface 106, supports the integrated circuit 108. The first molding compound 120 has a finished surface 204 above the integrated circuit 108. The outer row of the bond pads 112 is available for connection to other devices, such as circuits (not shown) or other substrates (not shown). The system interconnects 118 are formed on the bottom surface 106 to allow connection to the next level of system (not shown). The pattern of the system interconnects 118 forms a ball grid array (BGA).

Figure 3:
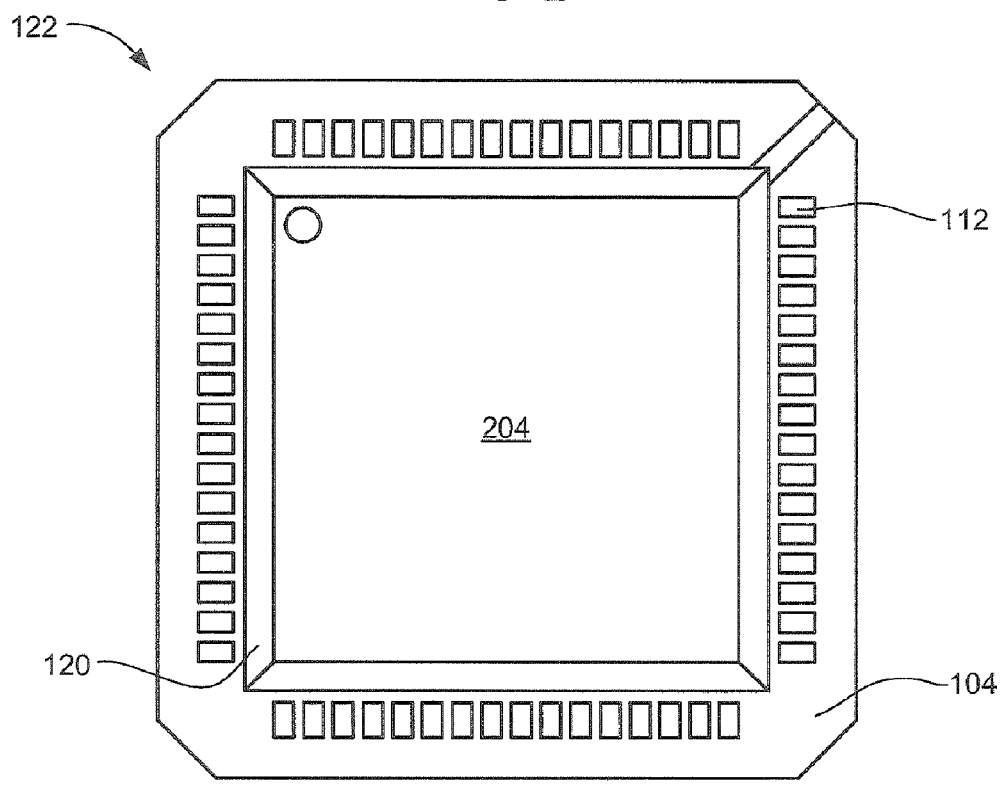
FIG. 3 is a top view of the base package of FIG. 2.

Referring now to FIG. 3, therein is shown a top view of the base package 122 of FIG. 2. The top view of the base package 122 depicts the relative position of the outer row of the bond pads 112, formed on the wide flange of the top surface 104, and the first molding compound 120 forming the finished surface 204 of the package top. The relative position and the number of the bond pads 112 may differ based on the number of contacts on the integrated circuit 108, of FIG. 1 or the interconnect strategy of the final package (not shown).

Figure 4:
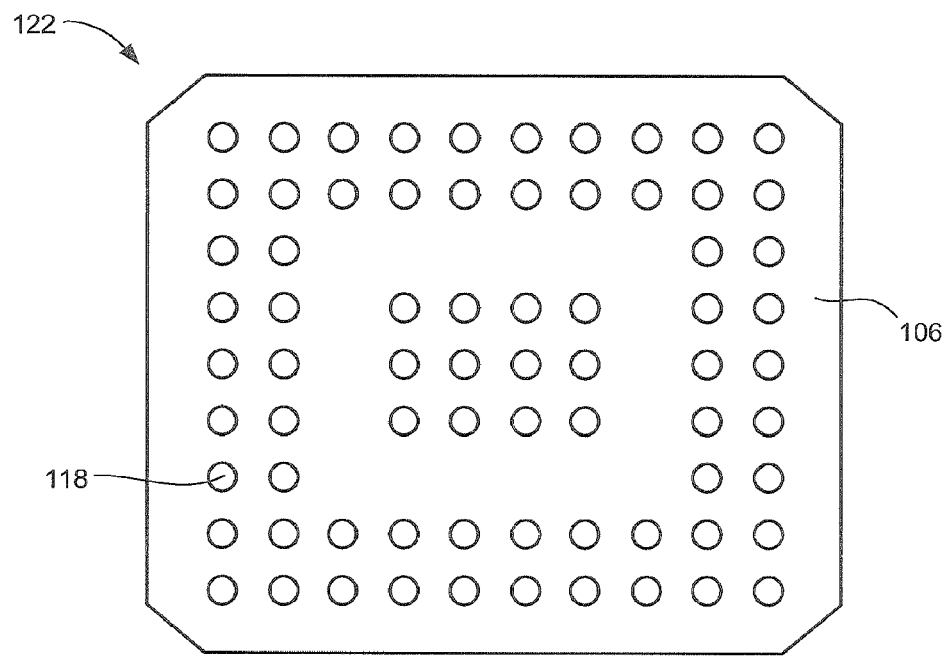
FIG. 4 is a bottom view of the based package of FIG. 2.

Referring now to FIG. 4, therein is shown a bottom view of the base package 122 of FIG. 2. The bottom view of the base package 122 depicts the bottom surface 106 having a pattern of the system interconnects 118, such as solder balls, solder columns or stud bumps. The number and pattern of the system interconnects 118 is for example only, and the number and position may vary. The system interconnects 118 provide the ball grid array interface.

Figure 5:
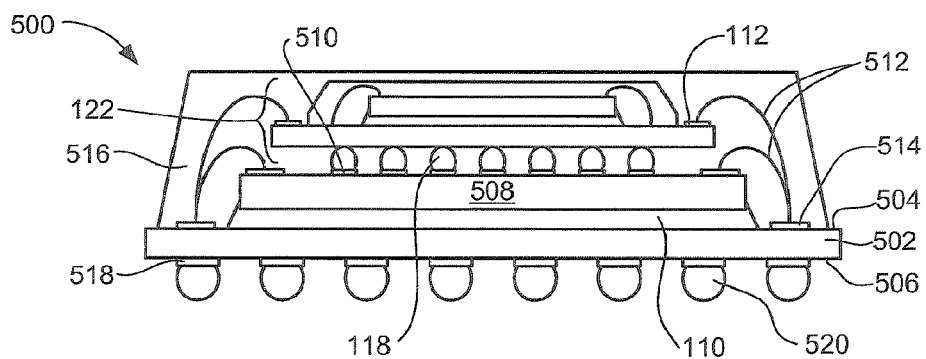
FIG. 5 is a cross-sectional view of the integrated circuit package system with die on base package utilizing the base package of FIG. 2.

Referring now to FIG. 5, therein is shown a cross-sectional view of an integrated circuit package system with die on base package 500 utilizing the base package 122 of FIG. 2. The cross-sectional view depicts a substrate 502, such as a laminate substrate or a ceramic substrate, having a substrate top 504 and a substrate bottom 506, with a flipchip die 508 attached with the adhesive 110 so that the active side is away from the substrate 502. The base package 122 is mounted on the active side of the flipchip die 508 such that the system interconnects 118 align with contact pads 510 of the flipchip die 508. Bond wires 512 provide electrical connection between the contact pads 510 of the flipchip die 508, the bond pads 112 of the base package 122 and substrate bond pads 514 of the substrate 502. The base package 122, the flipchip die 508, the bond wires 512 and substrate contacts are encapsulated in a molding compound 516. The substrate bottom 506 supports an array of system contacts 518, which connect to system interconnects 520, such as solder balls, solder columns or stud bumps.

Figure 6:
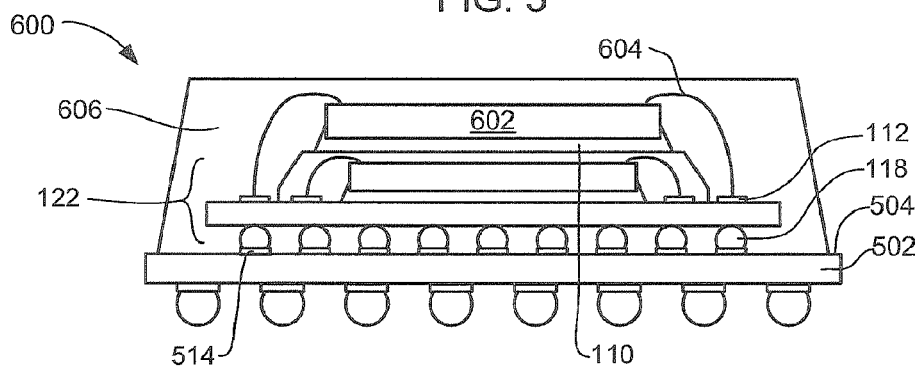
FIG. 6 is a cross-sectional view of the integrated circuit package system with die on base package utilizing the base package of FIG. 2.

Referring now to FIG. 6, therein is shown a cross-sectional view of an integrated circuit package system with die on base package 600 utilizing the base package 122 of FIG. 2. The cross-sectional includes the substrate 502 having the substrate bond pads 514 formed on the substrate top 504. The base package 122 is mounted on the substrate top 504 of the substrate 502, such that the system interconnects 118 are electrically connected to the substrate bond pads 514 by a connection process, such as a solder reflow process. A die 602 is attached to the top of the base package 122 with the adhesive 110, with the active side of the integrated circuit away from the base package 122. Bond wires 604 electrically connect the die 602 to the bond pads 112 of the base package 122. The base package 122, the die 602, the bond wires 604 and the substrate top 504 of the substrate 502 are encapsulated by a molding compound 606. The molding compound 606 provides a structural integrity and a moisture seal for the encapsulated components.

Figure 7:
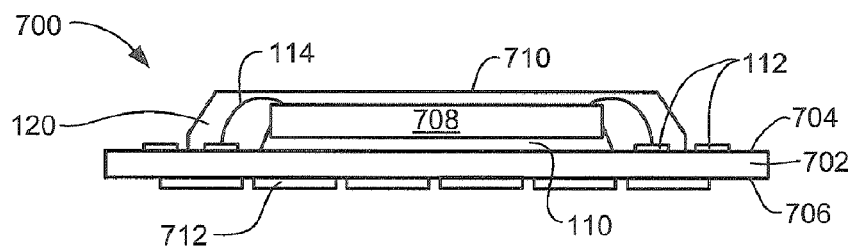
FIG. 7 is a cross-sectional view of a base package in an alternative embodiment of the present invention.

Referring now to FIG. 7, therein is shown a cross-sectional view of a base package 700 in an alternative embodiment of the present invention. The cross-sectional view of the base package 700 depicts a substrate 702, such as a laminate substrate or a ceramic substrate, having a substrate top 704 and a substrate bottom 706, and an integrated circuit 708 is attached to the substrate top 704 with the adhesive 110, such as the die attach material. The cross-sectional view also depicts the bond pads 112, in the inner row and the outer row, formed on the substrate top 704. The inner row of the bond pads 112 are electrically connected to the integrated circuit 708 by the first bond wires 114. The integrated circuit 708, the first bond wires 114, the inner row of the bond pads 112 and part of the substrate top 704 are encapsulated by the first molding compound 120. Leadless contacts 712 are formed on the substrate bottom 706, comprising a land grid array (LGA) interface.

Figure 8:
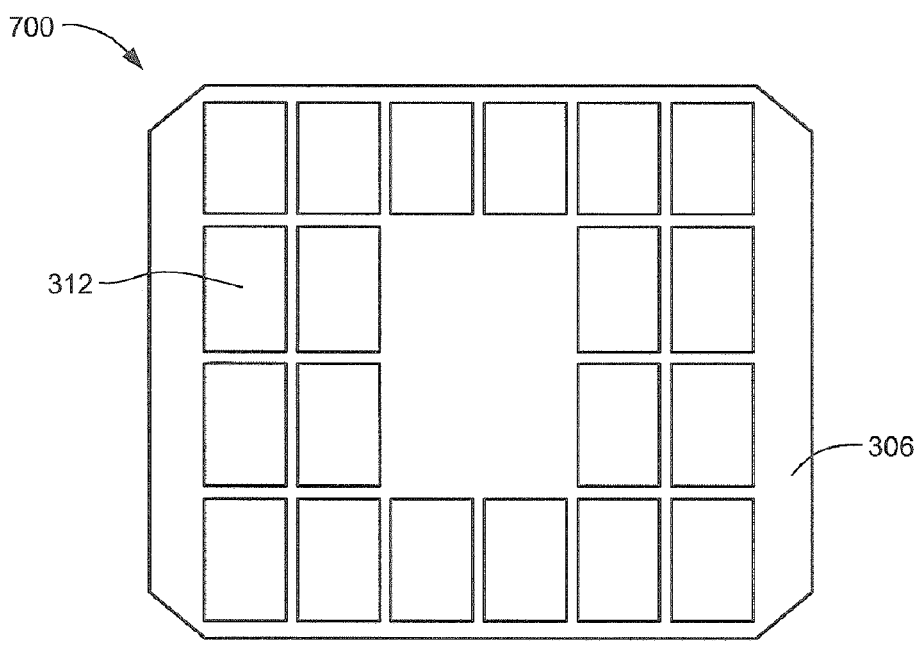
FIG. 8 is a bottom view of the based package of FIG. 7.

Referring now to FIG. 8, therein is shown a bottom view of the base package 700 of FIG. 7. The bottom view of the base package 700 includes the substrate bottom 706 and a pattern of the leadless contacts 712. The pattern, size and shape of the leadless contacts 712 is for example only and the pattern, size and shape may vary. The leadless contacts 712 form a land grid array interface on the bottom of the substrate 702.

Figure 9:
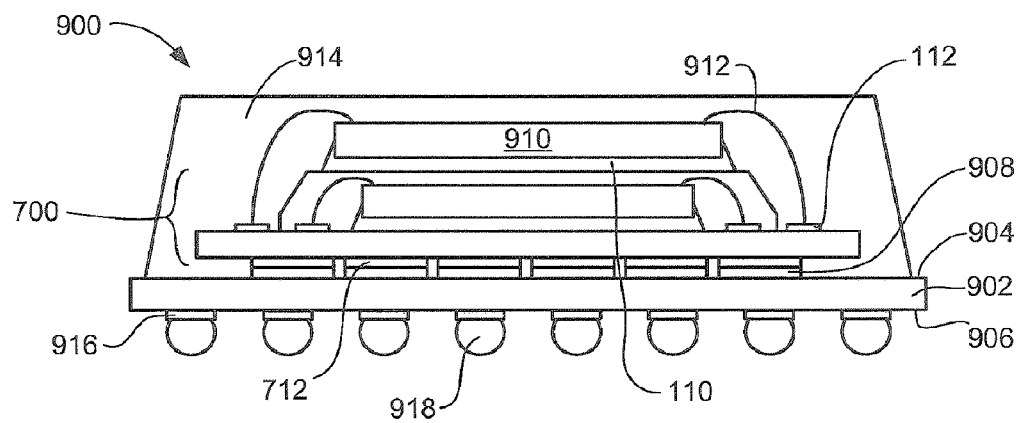
FIG. 9 is a cross-sectional view of an alternative embodiment of the present invention, utilizing the base package of FIG. 7.

Referring now to FIG. 9, therein is shown a cross-sectional view of an alternative embodiment of the present invention, utilizing the base package 700 of FIG. 7. The cross-sectional view of the alternative embodiment includes a substrate 902, such as a laminate substrate or a ceramic substrate, having a substrate top 904 and a substrate bottom 906. Substrate bond pads 908 are formed on the substrate top 904. The base package 700 is mounted on the substrate top 904 of the substrate 902, such that the leadless contacts 712 are electrically connected to the substrate bond pads 908 by a connection process, such as a solder reflow process. A die 910 is attached to the top of the base package 700 with the adhesive 110, with the active side of the integrated circuit facing away from the base package 700. Bond wires 912 electrically connect the die 910 to the bond pads 112 of the base package 700. The base package 700, the die 910, the bond wires 912 and the substrate top 904 of the substrate 902 are encapsulated by a molding compound 914. The molding compound 914 provides a structural integrity and a moisture seal for the encapsulated components. The substrate bottom 906 supports an array of system contacts 916, which connect to system interconnects 918, such as solder balls, solder columns or stud bumps.

Figure 10:
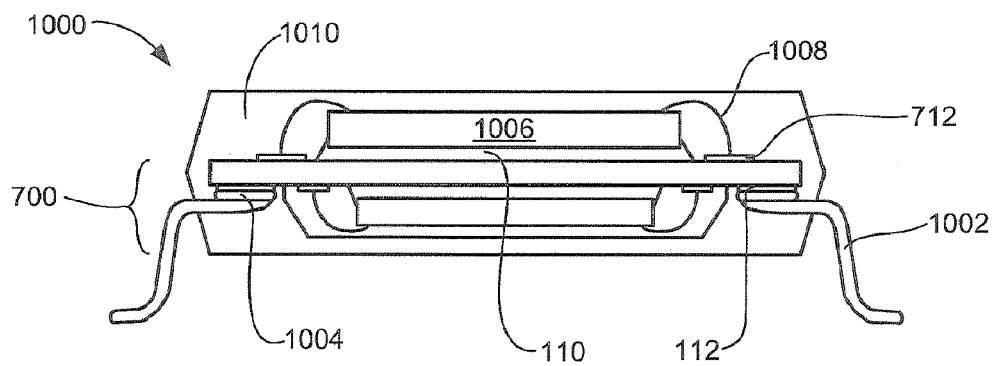
FIG. 10 is a cross-sectional view of the integrated circuit package system with die on base package utilizing the base package of FIG. 7.

Referring now to FIG. 10, therein is shown a cross-sectional view of an integrated circuit package system with die on base package 1000 utilizing the base package 700 of FIG. 7. The cross-sectional view depicts the base package 700 mounted, in an inverted position, on leads 1002, formed as interface interconnects such as quad flat pack (QFP) leads, "J" bend leads or plastic leaded chip carrier (PLCC) leads. The leads 1002 are connected to the bond pads 112, on the substrate top 704, of FIG. 7, of the base package 700, by a conductive structural material 1004, such as solder. A die 1006 is mounted, by the adhesive 110, on the bottom of the base package 700 with the active side away from the base package 700. Bond wires 1008 electrically connect the die 1006 with the leadless contacts 712 of the base package 700. A package molding compound 1010 encapsulates the base package 700, the upper portion of the leads 1002, the die 1006 and the bond wires 1008. The lower portion of the leads 1002 extend beyond the package molding compound 1010 and remains exposed. The package molding compound 1010 provides a structural integrity and a moisture seal for the encapsulated components.

Figure 11:
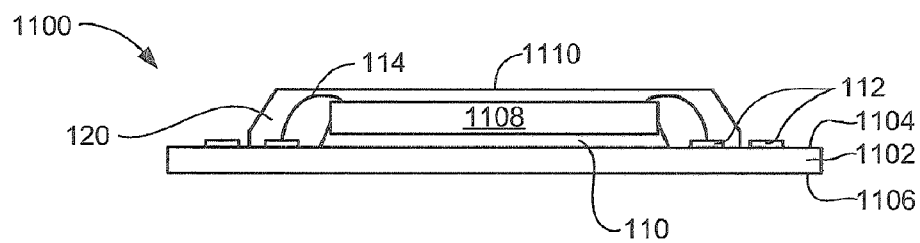
FIG. 11 is a cross-sectional view of a base package in another alternative embodiment of the present invention.

Referring now to FIG. 11, therein is shown a cross-sectional view of a base package 1100 in another alternative embodiment of the present invention. The cross-sectional view of the base package 1100 depicts a substrate 1102, such as a laminate substrate or a ceramic substrate, having a substrate top 1104 and a substrate bottom 1106. An integrated circuit 1108 is mounted on the substrate top 1104 using the adhesive 110, such as the die attach material. The inner row and the outer row of the bond pads 112 are formed on the substrate top 1104. The first bond wires 114 electrically connect the inner row of the bond pads 112 to the integrated circuit 1108. The first molding compound 120 encapsulates the integrated circuit 1108, the inner row of the bond pads 112, the first bond wires 114 and part of the substrate top 1104. A package top 1110 is available for device (not shown) mounting. There are no electrical connections on the substrate bottom 1106. Any electrical connection made to the base package 1100 must be made through the outer row of the bond pads 112 on the substrate top 1104.

Figure 12:
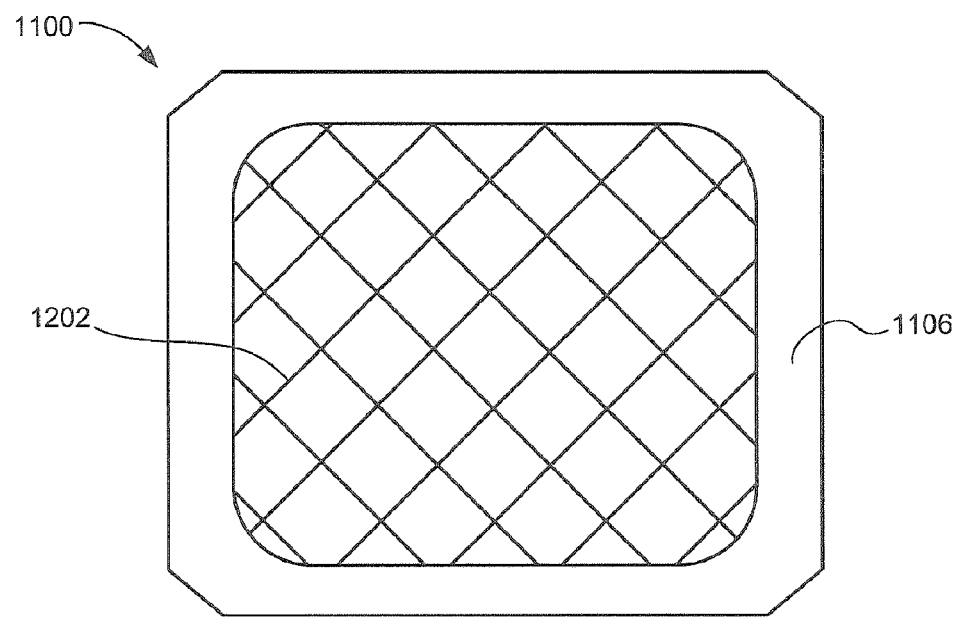
FIG. 12 is a bottom view of the based package of FIG. 11.

Referring now to FIG. 12, therein is shown a bottom view of the base package 1100 of FIG. 11. The bottom view of the base package 1100 includes the substrate bottom 1106 and a mesh backing 1202, such as copper covered by solder mask, which is optionally applied to reinforce the structure of the base package 1100. The pattern and location of the mesh backing 1202 is for example only, and the pattern and location may vary.

Figure 13:
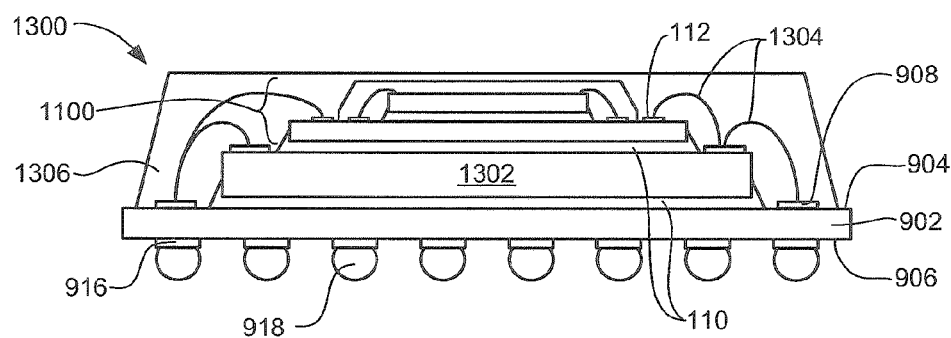
FIG. 13 is a cross-sectional view of the integrated circuit package system with die on base package utilizing the base package of FIG. 11.

Referring now to FIG. 13, therein is shown a cross-sectional view of a integrated circuit package system with die on base package 1300 utilizing the base package 1100 of FIG. 11. The cross-sectional view depicts the substrate 902, having the substrate top 904 and the substrate bottom 906, a die 1302 attached to the substrate top 904 by the adhesive 110, such as the die attach material. The active side of the die 1302 is facing away from the substrate 902. Substrate bond pads 908 are formed on the substrate top 904 of the substrate 902.

The base package 1100 is mounted on the active side of the die 1302 with the adhesive 110, such as the die attach material. Bond wires 1304 form electrical connections between the base package 1100, the die 1302 and the substrate bond pads 908. The array of system contacts 916 are formed on the substrate bottom 906 of the substrate 902. The system interconnects 918, such as solder balls, solder columns or stud bumps, are attached to the array of system contacts 916 for connection to the next level system (not shown). The base package 1100, the die 1302, the bond wires 1304, the substrate bond pads 908 and the substrate top 904 of the substrate 902 are encapsulated in a molding compound 1306. The molding compound 1306 provides protection, a moisture seal and structural rigidity to the integrated circuit package system with die on base package 1300.

Figure 14:
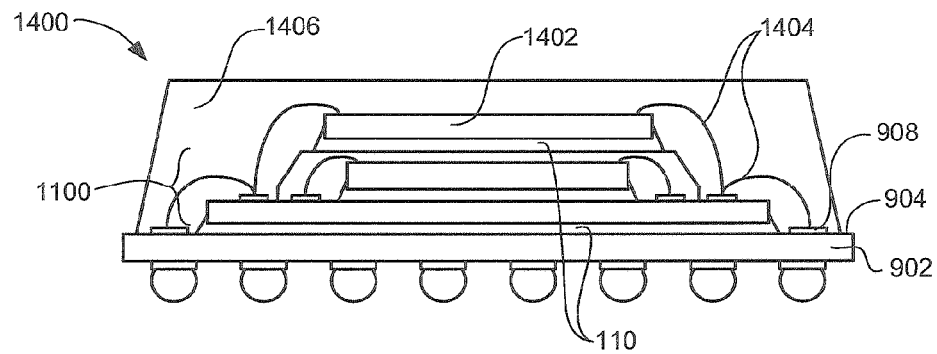
FIG. 14 is a cross-sectional view of the integrated circuit package system with die on base package utilizing the base package of FIG. 11.

Referring now to FIG. 14, therein is shown a cross-sectional view of a integrated circuit package system with die on base package 1400 utilizing the base package 1100 of FIG. 11. The cross-sectional view depicts the substrate 902 with the base package 1100 attached to the substrate top 904 with the adhesive 110. A die 1402 is mounted on the base package 1100 with the adhesive 110. The substrate bond pads 908 are formed on the substrate top 904 of the substrate 902. Bond wires 1404 electrically connect the base package 1100, the substrate bond pads 908 and the die 1402. A molding compound 1406 encapsulates the base package 1100, the substrate bond pads 908, the bond wires 1404, and the substrate top 904 of the substrate 902.

Figure 15:
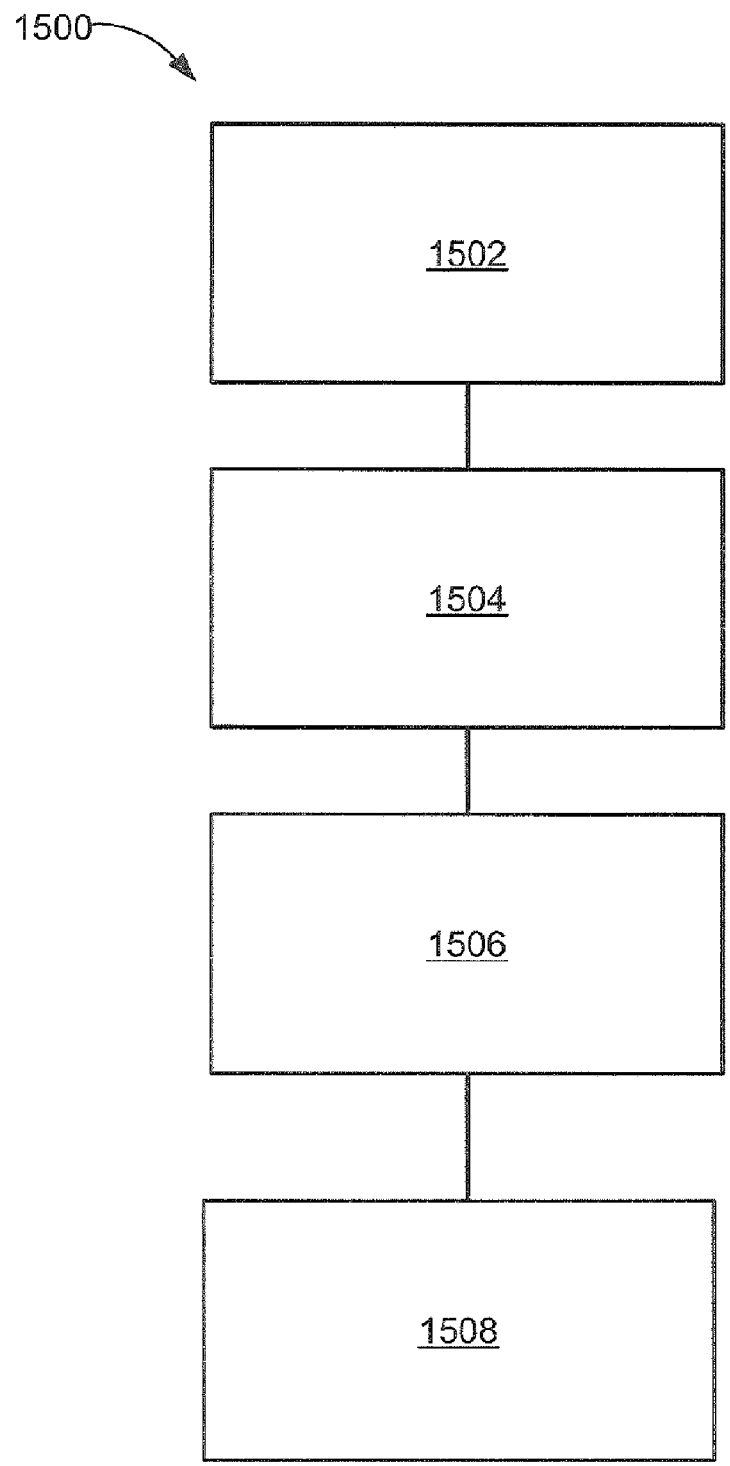
FIG. 15 is a flow chart of an integrated circuit package system with die on base package for manufacturing the integrated circuit package system with die on base package in an embodiment of the present invention.

Referring now to FIG. 15, therein is shown a flow chart of an integrated circuit package system with die on base package system 1500 for manufacturing the integrated circuit package system with die on base package 100 in an embodiment of the present invention. The integrated circuit package system with die on base package system 1500 includes forming a base package comprising forming a substrate, mounting an integrated circuit on the substrate, encapsulating the integrated circuit and the substrate with a molding compound and testing the base package in a block 1502; attaching a bare die to the base package in a block 1504; connecting electrically the bare die to the substrate in a block 1506; and encapsulating the bare die and the base package in a block 1508.

In greater detail, a method to manufacture an integrated circuit package system with die on base package, in an embodiment of the present invention, is performed as follows:

(1) 1. Forming a base package comprising forming a laminate substrate having bond pads in an inner row and an outer row, mounting an integrated circuit on the laminate substrate within the inner row of the bond pads, encapsulating the integrated circuit and the laminate substrate with a molding compound, wherein the molding compound encapsulates the integrated circuit and the inner row of the bond pads and testing the base package comprises verifying the base package to be known good. (FIG. 1)

(2) 2. Attaching a bare die to the base package comprises applying an adhesive to the base package for bare die attach. (FIG. 1)

(3) 3. Connecting electrically the bare die to the laminate substrate comprises attaching a bond wire between the bare die and the outer row of the bond pads on the laminate substrate. (FIG. 1) and (4) 4. Encapsulating the bare die and the base package comprises forming a package-in-package. (FIG. 1)

It has been discovered that the present invention thus has numerous aspects.

An aspect is that the present invention is that it provides an effective use of laminate based BGA and LGA packages in a wide variety of package-in-package configurations.

Another aspect is that the present invention improves the manufacturing yield of package-in-package devices by verifying the base package as "known good" prior to continuing assembly. The use of a base package in association with a bare die simplifies the assembly process as compared to stacked bare dice or stacked packages. The present invention also enables new package-in-package concepts.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system with die on base package method and apparatus of the present invention furnish important and heretofore unknown and unavailable solutions, capabilities, and functional aspects for the manufacture of package-in-package devices. The resulting processes and configurations are straightforward, cost-effective, uncomplicated, highly versatile and effective, can be implemented by adapting known technologies, and are thus readily suited for efficiently and economically manufacturing package-in-package devices that are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method for manufacturing an integrated circuit package system with die on base package comprising:
   forming a base package comprising:
      forming a substrate having a top surface, the top surface having an inner row and an outer row of bond pads electrically interconnected,
      mounting an integrated circuit on the top surface of the substrate and electrically connected to the inner row of bond pads,
      encapsulating the integrated circuit and the substrate with a base molding compound exposing the outer row of bond pads, and
      testing the base package using the outer row of bond pads;
   connecting interface interconnects to the base package including system interconnects, leadless contacts, or a combination thereof;
   attaching a bare die having an active side and a back side to the substrate by bond wires, the system interconnects, or a combination thereof on the active side;
   attaching an additional substrate to the back side; and
   encapsulating a package molding compound on the additional substrate covering the bond wires, the system interconnects, the bare die, and the base package.

2. The method as claimed in claim 1 further comprising forming a grid array interface on the base package, wherein the grid array comprises interfaces forming balls or lands on a bottom surface of the substrate.

3. The method as claimed in claim 1 wherein forming the base package comprises having all electrical connections on the top surface of the substrate.

4. The method as claimed in claim 1 further comprising connecting leads to the base package.

5. The method as claimed in claim 1 wherein the base package is electrically connected to the additional substrate.

6. A method for integrated circuit package system with die on base package comprising:
   forming a base package comprising:
      forming a laminate substrate having a top surface, the top surface having an inner row and an outer row of bond pads electrically interconnected,
      mounting an integrated circuit on the top surface of the laminate substrate within the inner row of the bond pads and electrically connected thereto,
      encapsulating the integrated circuit and the laminate substrate with a base molding compound, the base molding compound encapsulating the inner row of the bond pads with the outer row of the bond pads exposed, and testing the base package comprises verifying the base package to be known good using the outer row of bond pads;
connecting interface interconnects to the base package including system interconnects, leadless contacts, or a combination thereof;
attaching a bare die having an active side and a back side to the laminate substrate comprises attaching a bond wire, the system interconnects, or a combination thereof between the active side of the bare die and the bond pads on the laminate substrate;
attaching an additional substrate to the back side; and
encapsulating a package molding compound on the additional substrate covering the bond wires, the system interconnects, the bare die, and the base package.

7. The method as claimed in claim 6 further comprising forming a grid array interface on the base package, wherein the grid array comprises forming balls or lands on a bottom surface of the laminate substrate.

8. The method as claimed in claim 6 wherein forming the base package comprises having all electrical connections on the top surface of the laminate substrate requires making electrical connections on the outer row of the bond pads on the top surface of the laminate substrate.

9. The method as claimed in claim 6 further comprising connecting leads to the base package, the leads in a preformed position.

10. The method as claimed in claim 6 further comprising applying an adhesive between the base package and the additional substrate.

11. A system for integrated circuit package system with die on base package comprising:
a base package comprising:
a substrate having a top surface, the top surface having an inner row and an outer row of bond pads electrically interconnected,
an integrated circuit mounted on the top surface and electrically connected to the inner row of the bond pads, and
a base molding compound encapsulating the integrated circuit and the substrate, the base molding compound covering the inner row of bond pads and exposing the outer row of bond pads;
a bare die having an active side and a back side, the bare die attached to the base package on the active side;
bond wires, system interconnects, or a combination thereof attaching the bare die to the substrate;
an additional substrate attached to the back side;
interface interconnects connected to the base package include the system interconnects, leadless contacts, or a combination thereof; and
a package molding compound encapsulating the bond wires, the system interconnects, the bare die, and the base package, the package molding compound on the additional substrate.

12. The system as claimed in claim 11 further comprises a grid array interface formed on the base package, wherein the grid array comprises balls or lands formed on a bottom surface of the substrate.

13. The system as claimed in claim 11 wherein the base package comprises all electrical connections on the top surface of the substrate.

14. The system as claimed in claim 11 further comprising leads attached to the base package.

15. The system as claimed in claim 11 wherein the base package is electrically connected to the additional substrate.

16. The system as claimed in claim 11 wherein:
the base package further comprises:
a laminate substrate having the bond pads in the inner row and the outer row.

17. The system as claimed in claim 16 further comprises a grid array interface formed on the base package, wherein the grid array comprises balls or lands formed on the bottom surface of the laminate substrate.

18. The system as claimed in claim 16 wherein the base package comprises all electrical connections on the top surface of the laminate substrate requires electrical connections be made on the outer row of the bond pads on the top surface of the laminate substrate.

19. The system as claimed in claim 16 further comprises leads connected to the base package, the leads formed as quad flat pack leads, "J" bend leads, or plastic leaded chip carrier leads.

20. The system as claimed in claim 16 further comprising an adhesive between the base package and the additional substrate.

* * * * *